United States Patent
Blanco et al.

(10) Patent No.: US 7,815,738 B2
(45) Date of Patent: Oct. 19, 2010

(54) DEPOSITION TOOL CLEANING PROCESS HAVING A MOVING PLASMA ZONE

(75) Inventors: Ignacio Blanco, Allen, TX (US); Jin Zhao, Plano, TX (US); Nathan Kruse, Monument, CO (US)

(73) Assignee: Texas Instruments Incorporated, Dallas, TX (US)

( * ) Notice: Subject to any disclaimer, the term of this patent is extended or adjusted under 35 U.S.C. 154(b) by 865 days.

(21) Appl. No.: 11/459,819

(22) Filed: Jul. 25, 2006

(65) Prior Publication Data
US 2006/0254515 A1 Nov. 16, 2006

Related U.S. Application Data

(62) Division of application No. 10/653,661, filed on Sep. 2, 2003, now Pat. No. 7,112,546.

(51) Int. Cl.
C23C 16/455 (2006.01)
H01L 21/306 (2006.01)
(52) U.S. Cl. .................. 118/715; 156/345.26
(58) Field of Classification Search ............. 118/715; 156/345.26
See application file for complete search history.

(56) References Cited

U.S. PATENT DOCUMENTS

| 5,336,324 | A | * | 8/1994 | Stall et al. | 118/719 |
|---|---|---|---|---|---|
| 5,565,038 | A | * | 10/1996 | Ashley | 134/2 |
| 6,125,859 | A | | 10/2000 | Kao et al. | |
| 6,374,831 | B1 | | 4/2002 | Chandran et al. | |
| 7,112,546 | B2 | | 9/2006 | Blanco et al. | |
| 7,322,368 | B2 | | 1/2008 | Sekiya et al. | |
| 2002/0073922 | A1 | * | 6/2002 | Frankel et al. | 118/715 |
| 2002/0183977 | A1 | * | 12/2002 | Sui et al. | 702/188 |
| 2003/0005943 | A1 | * | 1/2003 | Singh et al. | 134/1.1 |
| 2003/0051665 | A1 | * | 3/2003 | Zhao et al. | 118/723 E |
| 2003/0119328 | A1 | * | 6/2003 | Fujisato | 438/709 |
| 2003/0183243 | A1 | * | 10/2003 | Collins et al. | 134/1 |
| 2006/0130873 | A1 | * | 6/2006 | Richardson et al. | 134/1.1 |
| 2007/0048882 | A1 | * | 3/2007 | Kutney et al. | 438/5 |
| 2008/0075888 | A1 | * | 3/2008 | Rajagopalan et al. | 427/579 |

* cited by examiner

*Primary Examiner*—Parviz Hassanzadeh
*Assistant Examiner*—Satish Chandra
(74) *Attorney, Agent, or Firm*—John J. Patti; Wade J. Brady, III; Frederick J. Telecky, Jr.

(57) ABSTRACT

The present invention provides, in one embodiment, a process for cleaning a deposition chamber (100). The process includes a step (100) of forming a reactive plasma cleaning zone by dissociating a gaseous fluorocompound introduced into a deposition chamber having an interior surface and in a presence of a plasma. The process (100) further includes a step (120) of ramping a flow rate of said gaseous fluorocompound to move the reactive plasma cleaning zone throughout the deposition chamber, thereby preventing a build-up of localized metal compound deposits on the interior surface. Other embodiments advantageously incorporate the process (100) into a system (200) for cleaning a deposition chamber (205) and a method of manufacturing semiconductor devices (300).

7 Claims, 4 Drawing Sheets

DEPOSITION TOOL CLEANING PROCESS HAVING A MOVING PLASMA ZONE

This application is a divisional of application Ser. No. 10/653,661, filed Sep. 2, 2003.

TECHNICAL FIELD OF THE INVENTION

The present invention is directed in general to the manufacture of semiconductor devices, and, more specifically, to an efficient deposition chamber cleaning process for deposition tools used in the manufacture of such devices.

BACKGROUND OF THE INVENTION

The formation of uniform layers on semiconductor substrates necessitates that the environment inside the deposition chamber of deposition tools, such as chemical vapor deposition (CVD) tools, be continuously monitored and cleaned for residue build-up and contaminants. Consider, for instance, a plasma enhanced chemical vapor deposition (PECVD) tool. Such a tool is commonly employed to deposit material layers, such as silicon dioxide ($SiO_2$) or fluorinated silicate glass (FSG) on a substrate, such as a silicon wafer. It is well known that over a period of use, the material layers form as deposits on the walls of a deposition chamber. The buildup of these material layer deposits is undesirable because the deposits can flake off from the chamber's interior surfaces and introduce defects into the substrate and overlying layers and decrease the uniformity of layers being deposited on the substrate and the overall quality of the device.

To reduce the build-up of material layer deposits, the deposition chamber is periodically cleaned in situ, usually using a fluorine-containing cleaning gas, referred to as a gaseous fluorocompound. Periodic in situ cleaning is typically done in-between chemical deposition procedures being performed on one or more batches of substrates. In situ cleaning procedures attempt to provide a balance between efficient chamber cleaning in a minimum period and using a minimum amount of fluorocompound. For instance, a conventional cleaning procedure uses a two-step process where the cleaning gas is introduced at two different rates: a high flow and a low, for the first and second steps, respectively. Over time, however, such cleaning procedures become less effective, leading to increased numbers of defective semiconductor devices being produced in the chamber. Moreover, as the yield of functional devices produced from the chamber continues to decrease, it eventually becomes necessary to stop semiconductor device fabrication and replace the dome of the deposition chamber, thereby increasing the overall costs of semiconductor device fabrication.

Accordingly, what is needed in the art is an efficient in situ cleaning process that allows the production of semiconductor devices with low numbers of defects and thereby extend the time between dome changes of the deposition chamber.

SUMMARY OF THE INVENTION

To address the above-discussed deficiencies of the prior art, the present invention provides a process for cleaning a deposition chamber. The process includes forming a reactive plasma cleaning zone by dissociating a gaseous fluorocompound introduced into a deposition chamber having an interior surface and in a presence of a plasma. The process also includes ramping a flow rate of the gaseous fluorocompound to move the reactive plasma cleaning zone throughout the deposition chamber, thereby preventing a build-up of localized metal compound deposits on the interior surface.

Another embodiment of the present invention is a system for cleaning a deposition chamber. The system includes a deposition chamber having an interior surface and configured to perform chemical vapor depositions on substrates. The system further includes a controller configured to provide a ramped cleaning process, as described above, in between the chemical vapor depositions.

In yet another embodiment, the present invention provides a method of manufacturing semiconductor devices. The method includes transferring one or more substrate into a deposition chamber having an interior surface and depositing material layers on the substrate. The method further includes cleaning the deposition chamber using an in situ ramped cleaning process, as described above, when material layer deposits in the deposition chamber reaches a predefined thickness.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes the advantageous use of a deposition chamber cleaning process that moves a reactive plasma cleaning zone throughout the deposition chamber versus prior art processes that localize the plasma reaction to only certain zones within the deposition chamber. As a result, the cleaning processes of the present invention substantially uniformly exposes the interior surfaces of the deposition chamber to the reactive plasma cleaning zone during cleaning. This, in turn, reduces the duration of exposure of any region of the interior chamber's surface to the highly reactive species of the reactive plasma cleaning zone, thereby reducing the build up of localized metal compound deposits inside the chamber.

The term reactive plasma cleaning zone as used herein refers to the most dense region of reactive species that are produced by dissociation of a fluorocompound in the presence of a plasma. For instance, $NF_3$ gas in the presence of a high density plasma discharge dissociates to produce reactive fluorine species, such as fluorine radical (F·) and nitrogen fluoride radicals ($NF_x$·, x=1 or 2). Similarly, fluorocarbon gas in the presence of such a plasma dissociates to produce reactive species, such as fluorine radical (F·) and fluorocarbon radicals (e.g., $CF_x$·, x=1 to 3).

Because these species are highly reactive, they are also short lived. Thus, when fluorocompound cleaning gases are first introduced into a deposition chamber and dissociate in the presence of a plasma, the reactive plasma cleaning zone comprising a dense region or cloud of these reactive species, will transiently form in a localized volume of the chamber, and then diffuse and react with oxide deposits, the chamber walls and each other. As new gaseous fluorocompound is introduced into the chamber, the reactive species in the reactive plasma cleaning zone are replenished. Moreover, by changing the flow rate at which gaseous fluorocompound is introduced into the chamber, the reactive plasma cleaning zone can be moved to different locations in the chamber, as further explained below.

The cleaning process of the present invention is in contrast to traditional cleaning protocols used for deposition chambers. The traditional view is that it is sufficient to introduce a cleaning gas at, for example, a high flow rate in a first cleaning step, and then reduce the flow rate of the gas in a second cleaning step. It is thought that the first step cleans the upper portion of the chamber, while the second step further cleans the walls and lower portions of the chamber. The fact that this method of cleaning is well ingrained in the field is demonstrated by the fact that certain commercial cleaning systems are only configured for two-step or three-step cleaning processes and are not designed to be re-configured to implement a cleaning process such as disclosed in the present invention.

The present invention benefited from the novel recognition that the reactive plasma cleaning zone is not uniformly distributed throughout the interior surface of the deposition chamber during conventional two- or three-step cleaning processes. Rather, it has been learned that conventional in situ cleaning processes allow excessive reactions to occur between the interior walls of the chamber and the reactive species of localized reactive plasma cleaning zones. This, in turn, results in the formation of localized metal compound deposits on the interior walls of the chamber that introduce defects into semiconductor devices fabricated in the chamber.

As further illustrated in the example section below, consider a conventional two-step plasma cleaning process where $NF_3$ cleaning gas is introduced into a deposition chamber having an aluminum dome, at two different flow rates, high and low. The periodic use of such a cleaning process results in the formation of localized aluminum fluoride (e.g., $AlF_3$) deposits inside the chamber. In particular, larger amounts of metal compound deposits are formed in certain regions, such as the top of the dome and near gas injectors and the chuck located at the bottom of the chamber, than in other regions of the chamber.

The localized aluminum fluoride deposits formed when using two-and three step cleaning processes can reach thickness of between about 0 and about 1000 microns. These metal compound deposits can delaminate during the deposition of silicon oxide or fluorinated silicate glass layers onto substrate wafers. In particular, thermal cycling of the chamber, due to using different radio-frequency powers during PECVD procedures for device fabrication, promotes delamination of these localized metal compound deposits. Particles comprising the metal compound deposits fall onto wafers during semiconductor device fabrication and introduce defects into semiconductor devices, similar to the well known flaking off of silicon oxide or FSG deposits, as described above. For certain fabrication processes, it has been estimated that defects from aluminum fluoride particles account for a 3 percent loss in the yield of functional semiconductor devices.

Figure 1:
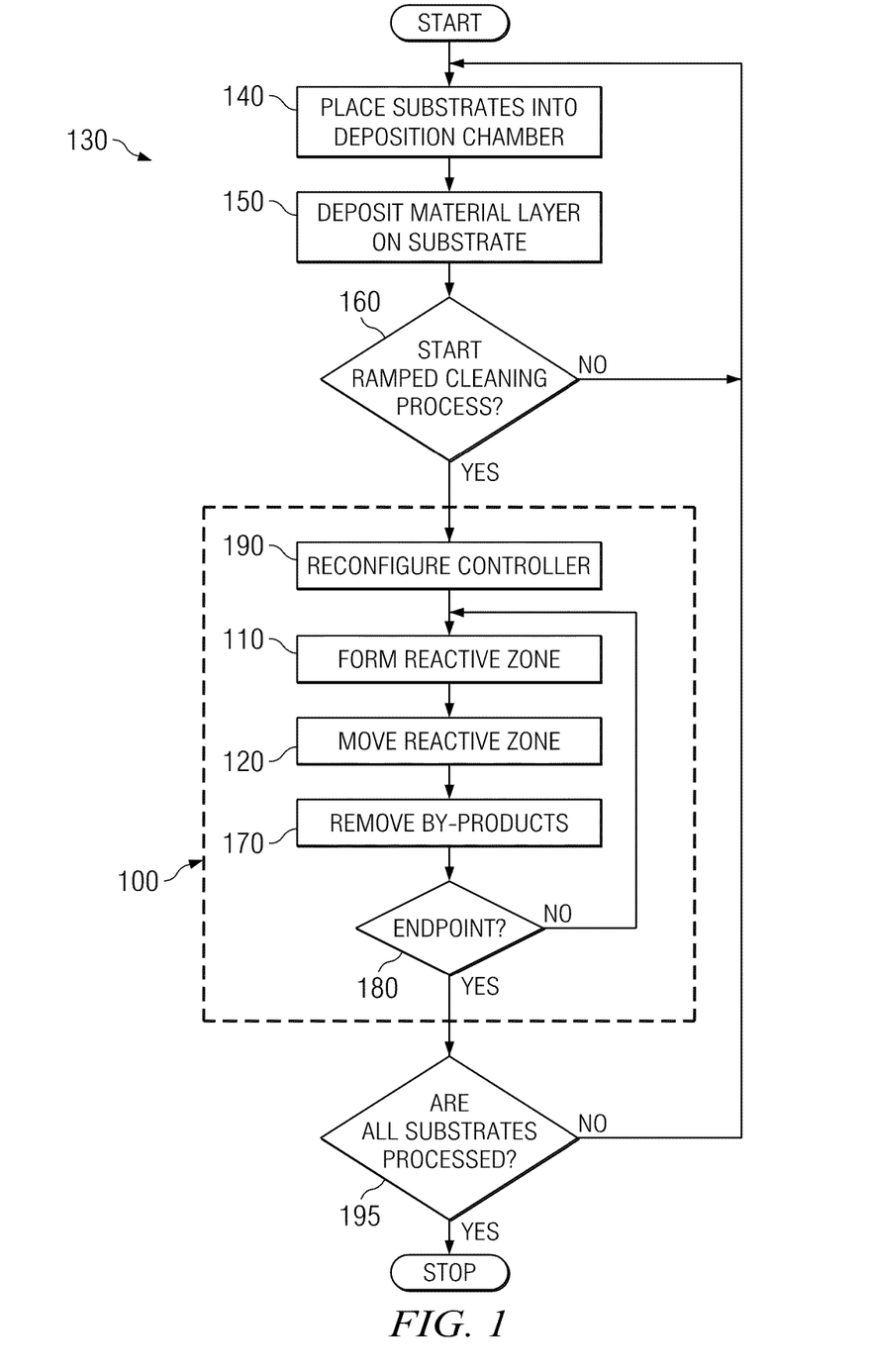
FIG. 1 illustrate by flow diagram, selected steps of one embodiment of a ramped cleaning process of the present invention.

One embodiment of the present invention is a process for cleaning a deposition chamber. FIG. 1 presents by flow diagram, selected steps of an exemplary ramped cleaning process 100 following the principles of the present invention. In step 110 of the process 100, a reactive plasma cleaning zone ("reactive zone") is formed by dissociating a gaseous fluorocompound introduced into a deposition chamber in a presence of a plasma. In step 120, a flow rate of the gaseous fluorocompound is ramped to move the reactive plasma cleaning zone throughout the deposition chamber. This, in turn, prevents a build-up of localized metal compound deposits on interior surfaces of the deposition chamber.

In some embodiments of the ramped cleaning process, ramping of the flow rate of the gaseous fluorocompound is achieved by adjusting the flow rate according to a ramp function. In certain embodiments, the ramp function defines a linear change in the flow rate over a cleaning time. Thus, the ramp function is $(FR)_T = M(T) + (FR)_0$, where, $(FR)_T$ is the flow rate of the gaseous fluorocompound and time T, $(FR)_0$ is the starting flow rate and M in the change in flow rate per unit time. For instance, when M is a negative number, the linear change in flow rate corresponds to a decrease in the flow rate until the flow rate is zero, or some other predefined endpoint. In certain preferred embodiments where the ramp function is a linearly decreasing ramp of the flow rate, M is between about −5 and about −20 sccm/s, and more preferably between about −7 and −9 sccm/s.

Of course, one skilled in the art should understand that the ramp function is approximated by starting the flow rate at the desired highest value (e.g., $(FR)_0$) for a fraction of the total cleaning time, and then decreasing the flow rate by fixed increments and maintaining the flow rate at the decreased value for the same fraction of time, until the desired endpoint is reached. As an example, for a total cleaning time of 120 seconds, $(FR)_0$ can be started at 1000 sccm for 12 s, and then decreased by 100 sccm increments to 900 sccm for 12 s, and then decreased by 100 sccm to 800 sccm for 12 sec, etc. . . . , until a flow rate of zero is obtained. Such a cleaning protocol approximates an M value of about −8.2 sccm/s.

In other embodiments, however, the linear change in the ramp function corresponds to a fixed increase in the flow rate, that is, M is positive. Using an analogous example to that given above, $(FR)_0$ can start at 100 sccm for 12 s and then increases by 100 sccm increments until the flow rate of 1000 sccm is reached for 12 s, at which point the flow rate is dropped to zero, and the cleaning process is terminated or repeated, as desired.

In yet other embodiments, the ramp function defines a nonlinear change in the flow rate of the gaseous fluorocompound over a cleaning time. Such embodiments can advantageously provide a shorter or longer cleaning periods for certain areas of the deposition chamber, as needed. In some embodiments, it is desirable to provide a longer period of cleaning in the upper portion of the chamber by introducing the gaseous fluorocompound at higher flow rates for a longer portion of the cleaning period. In such instances, the ramp function can be a higher order polynomial equation, such as $(FR)_t=A(T)^2+B(T)+(FR)_0$, where A and B are constants. In an alternative application, the ramp function can be a second order polynomial, where A and B are about $-0.07$ s$^{-2}$ and about $-1$ s$^{-1}$, respectively.

It is desirable to provide a shorter period of cleaning in the upper portion of the chamber, by introducing the gaseous fluorocompound at higher flow rates for a shorter portion of the cleaning period. In such embodiments, the ramp function is an exponential function such as $(FR)_t=(FR)_0 \cdot \exp(N \cdot T)$, where N is a constant having a negative value. An example of an exponentially decreasing flow rate as a function of time includes $(FR)_0$ is about 1000 sccm and N is about $-0.03$ s$^{-1}$. Of course, one of ordinary skill in the art should understand that any number of ramp functions could be defined or combined so as to tailor the ramped cleaning process 100 to the particular deposition chamber of interest.

The scope of the present invention includes the use of any gaseous fluorocompound for cleaning deposition chambers. In certain preferred embodiments, the gaseous fluorocompound is nitrogen trifluoride ($NF_3$), or a perfluorocarbon such as tetrafluoromethane ($CF_4$), hexafluoroethane ($C_2F_6$) or octofluoropropane ($C_3F_8$), or mixtures thereof. In one advantageous embodiment, nitrogen trifluoride ($NF_3$) is used because of its higher etch rates of material layer deposits, such as silicon oxides or FSG deposits, lower cost and lower environmental impact, as compared to fluorocarbons.

The gaseous fluorocarbon can be supplemented with additional cleaning gases that improve the efficient of the process 100, if so required. For example, the cleaning process may further include introducing oxygen ($O_2$) into the deposition chamber. Preferably, oxygen is introduced at a flow rate that is a fixed percentage of a flow rate of the gaseous fluorocompound. For instance, in certain preferred embodiments, the flow rate of $O_2$ is introduced at a flow rate that is between about 1 and about 50 percent, and more preferably between about 5 and about 15 percent, of the flow rate of the gaseous fluorocompound. Thus, in certain embodiments, the flow rate of oxygen is ramped according to the same ramp function used to control the flow rate of the gaseous fluorocompound. In other embodiments, however, it is advantageous to introduce oxygen at a constant flow rate, or according to a different ramp function to tailor the movement of the reactive plasma cleaning zone throughout the chamber.

In one particular embodiment of the ramped cleaning process 100, the deposition chamber is maintained at a pressure of between about 0.5 and about 4 Torr and more preferably between about 1 and about 3 Torr during the ramped cleaning process 100. In other embodiments, however, the pressure inside the chamber can be changed during the ramped cleaning process 100. As noted above, ramped cleaning process 100 includes the generation of a plasma, such as a radio frequency or microwave plasma. In the presence of a plasma, the above-described gaseous fluorocompound and other gases are more reactive and therefore, the total time necessary for cleaning is advantageously reduced. In still other embodiments, the plasma is produced by applying a constant radio-frequency energy to the deposition chamber at a power of between about 100 and 10000 Watts and more preferably between about 4000 and 4500 Watts. In yet other embodiments, however, the strength of the plasma can be changed during the ramped cleaning process 100.

Some embodiments of the cleaning process 100 are advantageously integrated as in situ cleaning processes as part of a process 130 for manufacturing semiconductor devices. In such embodiments, the deposition chamber can be part of a conventional CVD tool, such as a PECVD tool. As well understood by those skilled in the art, substrates, such as silicon wafers, are placed into the chamber, in step 140, and one or more material layers are formed on the surface of substrates, in step 150.

The chemical composition of material layer deposits that form on the interior surfaces of the chamber during the manufacturing process 130 depends on the type of deposition procedure being performed and the composition of the chamber. For instance, when silicon oxide and silicon nitride layers are formed on a substrate, material layer deposits in aluminum chambers are composed primarily of silicon oxides and silicon nitrides, respectively. When FSG layers are deposited, then material layer deposits in the aluminum chamber similarly includes silicon oxides.

As well understood by those skilled in the art, any number of indicators can be used to trigger the ramped cleaning process 100. In certain embodiments, the cleaning process 100 is initiated, in step 160, after every substrate is processed according to steps 140 and 150. In other embodiments, however, the ramped cleaning process 100 is initiated in step 160, only when the material layer deposits in the chamber exceed a predefined limit. In some embodiments, the cleaning is commenced, for example, when the thickness of FSG deposits inside the chamber is estimated to reach a predefined maximum, such as about 5 to about 10 microns thick.

One skilled in the art should understand that the gaseous fluorocompound and other cleaning gases serve as etchants that react with the material layer deposits to produce cleaning by-products. Such byproducts can be removed from the chamber, in step 170 through gas outlets in the chamber. One skilled in the art should also understand that cessation of the ramped cleaning process 100 may be prompted by any number of endpoints, in step 180. In some embodiments of the process 100, for instance, the endpoint 180 simply corresponds to a single execution of ramped cleaning according to the ramp function, as described above. In other embodiments of the process 100, however, the endpoint 180 corresponds to a change in the concentration of cleaning by-products, such as an increase in fluorine and decrease carbon monoxide, produced from reactions between the fluorocarbon gas and oxide deposits in the chamber.

The method cleaning process 100 may also include a step 190 of modifying a controller to provide a ramped cleaning process controller. Such embodiments are applicable, for instance, where the deposition chamber originally had a controller configured to conduct a two-step cleaning process. These embodiments may further include implementing the ramped cleaning process controller to execute the ramp function. In step 195, it is determined if the manufacturing process 130 should be stopped, or continued by repeating steps 140 and 150, if additional substrates (e.g., wafers) are to be processed.

Figure 2:
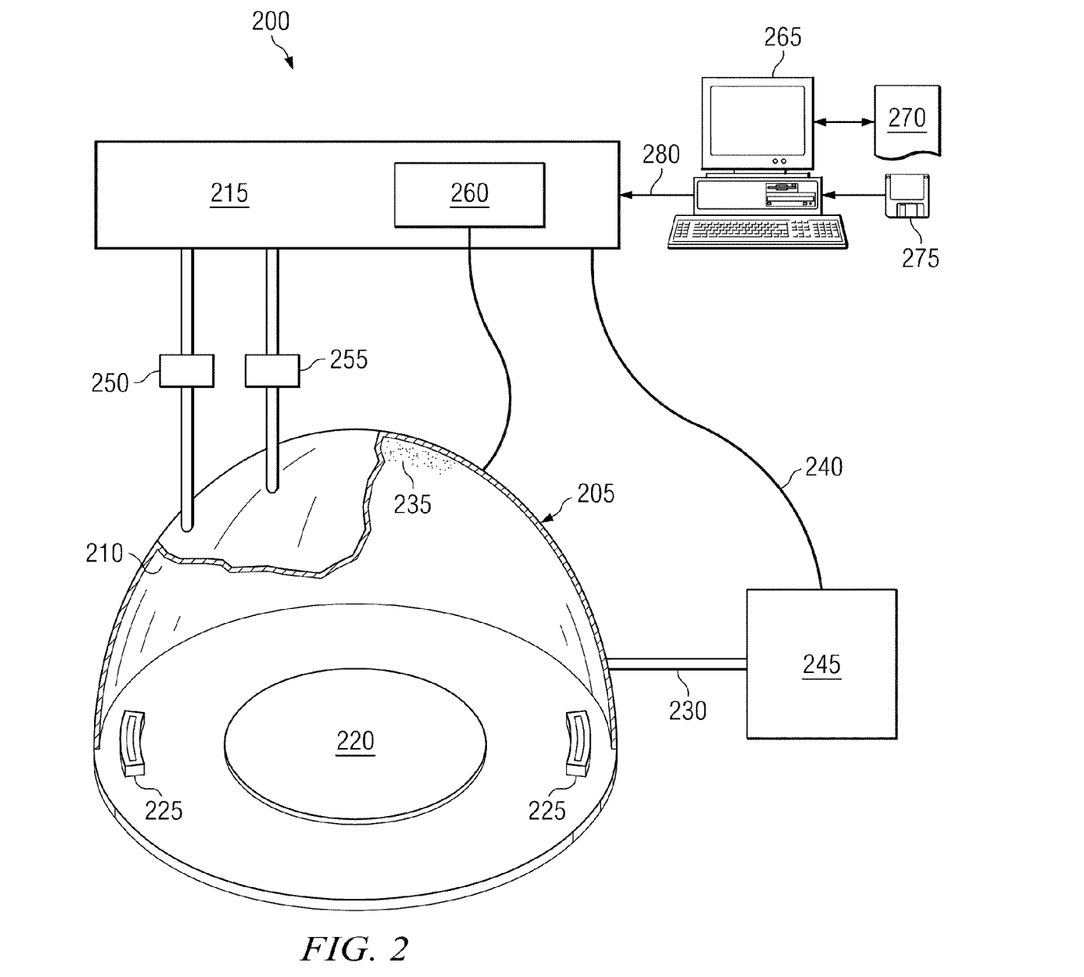
FIG. 2 presents a block diagram of one embodiment of a system for cleaning a deposition chamber according to the principles of the present invention.

Yet another embodiment of the present invention is illustrated in the block diagram of FIG. 2, a system 200 for cleaning a deposition chamber 205. The deposition chamber 205 has an interior surface 210 and is configured to perform chemical vapor deposition. The system further includes a controller 215 configured to provide a cleaning process in-between the chemical vapor deposition. The cleaning process can be any of the embodiments of the ramped cleaning process of the present invention, such as illustrated in FIG. 1 and described above, can be used in the system 200.

In some embodiments, the system 200 includes a deposition chamber 205 having one or more substrate stations 220 contained therein, each substrate station 220 having one or more injectors 225. The controller 215 can be configured to initiate the ramped cleaning process after each substrate or batch of substrates is processed in the chamber 205. Other embodiments of the system 200 further include a detector 230 configured to monitor cleaning by-products of material layer deposits 235 in the deposition chamber 205, and the controller 215 is configured to initiate the ramped cleaning process in response to a signal 240 from the detector 230.

In certain preferred embodiments, the detector 230 sends the signal 240 to the controller 215 when cleaning by-products of the material layer deposits 235 change by a predefined amount. In some embodiments, for example, the detector 230 includes an optical spectrometer 245 configured to measure optical emissions from cleaning by-products produced from a reaction between the deposits 235 and the gaseous fluorocompound. Preferably, the optical spectrometer 245 measures optical emissions from one or more of fluorine and carbon monoxide at wavelengths of about 704 and 483 nanometers, respectively.

In particular embodiments of the system 200, where the controller 215 is originally configured to conduct a two-step cleaning process, the controller 215 is modified to provide a ramped cleaning process controller 215. Such embodiments further include using the ramped cleaning process controller 215 to execute ramped function described above. The controller 215 may also be configured to include one or more mass flow controllers 250, 255 for introducing fluorocompounds or other cleaning gases into the deposition chamber 205. For example, in some preferred embodiments, the controller 215 is configured to actuate the flow of cleaning gases, such as $NF_3$ and $O_2$ through a gas delivery system, such as an injector system 225 inside the deposition chamber 205. Other gas delivery systems, such as a showerhead system could also be used, however. In yet other embodiments, the controller 215 is also configured to regulate a radio frequency power source 260 used to generate a plasma inside the deposition chamber 205 during the ramped cleaning process.

The system 200 may also include a computer 265 configured to read a data file 270 having settings, including the ramp function, for the ramped cleaning process used by the controller 215. Such settings can also include parameters, such as gas flow rates, radio frequency power setting, chamber pressures, and the durations of particular settings. Other embodiments of the system 200 also include a computer readable media 275 that is capable of causing the computer 265 to produce a control signal 280 that causes the controller 215 to initiate the ramped cleaning process or to cease the cleaning cycle. The computer readable media 275 can comprise any computer storage tools including, but not limited to, hard disks, CDs, floppy disks, and memory or firmware.

Figure 3A:
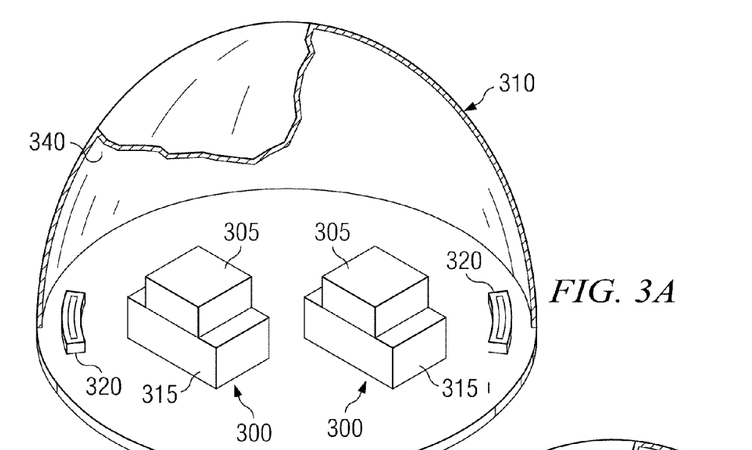
FIGS. 3A to 3C illustrate cross sectional views of selected steps of an embodiment of a method of manufacturing a semiconductor device according to the principles of the present invention.
Figure 3B:
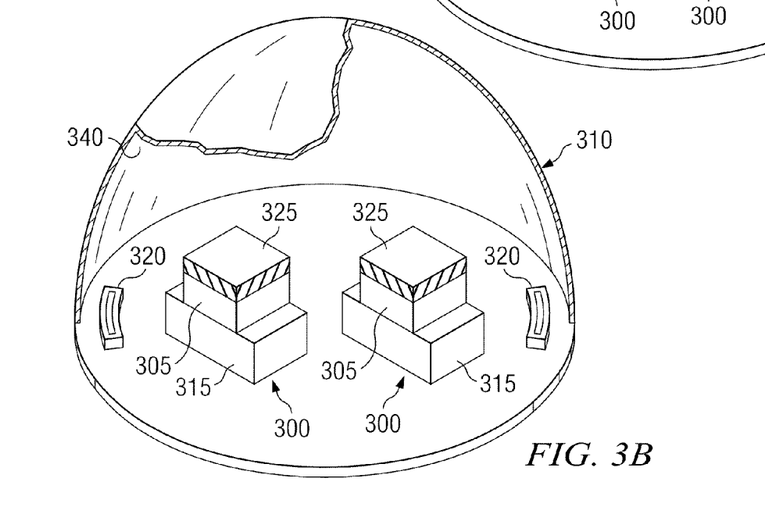
Figure 3C:
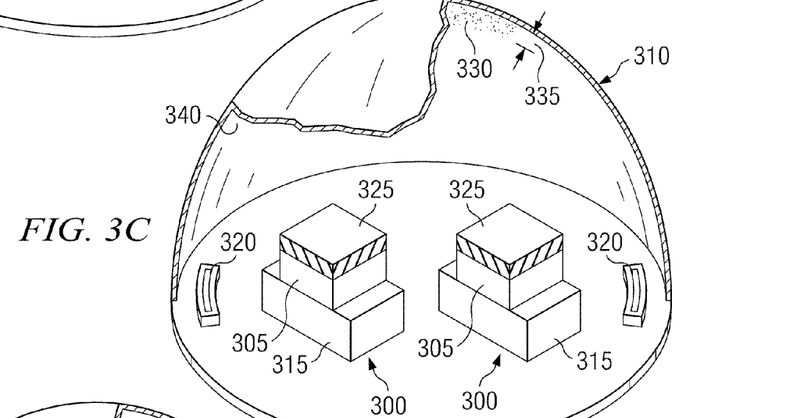

In yet another embodiment of the present invention there is presented a method of manufacturing semiconductor devices. FIGS. 3A to 3C illustrate cross sectional views of selected steps of an embodiment of a method of manufacturing a semiconductor device 300 according to the principles of the present invention. Turning first to FIG. 3A, the method includes transferring one or more semiconductor substrates 305 into a deposition chamber 310 having one or more substrate stations 315 contained therein. Preferably the deposition chamber includes a gas delivery system, such as an injector system 320 at one or more substrate stations 315.

As shown in FIG. 3B, material layers 325 are deposited on the semiconductor substrates 305. In certain embodiments, the material layers 325 are inter-level, or in other embodiments, a top level, dielectric layers 325. For example, the material layers 325 may be silicon dioxide or silicon nitride, while in other embodiments, the material layers 325 are FSG. Typically, the deposition is carried out using conventional CVD or PECVD procedures, well known to those skilled in the art.

As shown in FIG. 3C, the method 300 further includes cleaning the deposition chamber 310 using an in situ cleaning process when material layer deposits 330 in the deposition chamber 310 reach a predefined thickness 335. The in situ ramped cleaning process may comprise any of the previously described cleaning processes of the present invention. The predefined thickness 335 can be estimated from a rate of depositing the material layers 325 on the substrates 305. For example, in some embodiments using a TEOS process to deposit silicon dioxide layers 325 on silicon wafer substrates 305, the predefined thickness 335 is at least about 5 to about 100 microns.

In certain preferred embodiments, the method 300 further includes replacing a dome 340 of the deposition chamber 310 when a yield of functional semiconductor device 300 decreases below a predefined limit. In certain preferred embodiments, for example, the predefined limit is an about 2 percent yield of functional semiconductor devices, and wherein a period until said dome change is at least about 200 deposition hours.

Having described the present invention, it is believed that the same will become even more apparent by reference to the following examples. It will be appreciated that the examples are presented solely for the purpose of illustration and should not be construed as limiting the invention. For example, although the experiments described below may be carried out in a laboratory setting, one skilled in the art could adjust specific numbers, dimensions and quantities up to appropriate values for a full-scale production plant setting.

EXAMPLES

The following examples are presented to illustrate the effectiveness of the ramped cleaning process of the present invention as compared to a conventional two-step cleaning process. A single-chambered HDPCVD tool (Novellus Sequel System, San Jose, Calif.) having one substrate station was used. For test purposes, about 4500 Angstrom thick layers of FSG, comprising about 4.5 percent fluorine and balance silicon dioxide, were deposited on silicon wafers using a conventional HDPCVD process. The tool was configured to run an intermittent in situ cleaning processes between every 6 micron deposition of FSG.

For illustrative purposes, the results for two in situ cleaning processes are compared: a conventional two-step cleaning process and a ramped cleaning process of the present invention. For both cleaning processes, the pressure inside the chamber was maintained at about 2 Torr and the radio-frequency power used for plasma generation was about 4300 Watts. The flow rate of $NF_3$ (FR-$NF_3$) and $O_2$ (FR-$O_2$) and their durations (Time) are summarized in TABLE 1.

TABLE 1

| Time (seconds) | FR-$NF_3$ (sccm) | FR-$O_2$ (sccm) |
|---|---|---|
| Two-Step Cleaning Process (prior art) | | |
| ~190 | ~1000 | ~100 |
| ~104 | ~100 | ~10 |
| Ramped Cleaning Process | | |
| ~36 | ~1000 | ~100 |
| ~36 | ~900 | ~90 |

TABLE 1-continued

| Time (seconds) | FR-NF$_3$ (sccm) | FR-O$_2$ (sccm) |
|---|---|---|
| ~36 | ~800 | ~80 |
| ~36 | ~700 | ~70 |
| ~36 | ~600 | ~60 |
| ~36 | ~500 | ~50 |
| ~36 | ~400 | ~40 |
| ~36 | ~300 | ~30 |
| ~36 | ~200 | ~20 |
| ~36 | ~100 | ~10 |

The plurality of NF$_3$ and O$_2$ flow rates used in the ramped cleaning process approximated a linearly decreasing ramp function having a slope of about −8.3 sccm/sec. The duration of the plurality of flow rates was selected so as to provide the deposition chamber with the same volume of exposure to NF$_3$ as in the two-step process (e.g., 190×1000+104×(100) for the two-step process).

In order to perform a ramped cleaning process on the Novellus Speed System, it was necessary to reconfigure the software program that controls the two-step cleaning process originally provided with the system, into a ramped cleaning process. In particular, new parameters to control the flow rates of NF$_3$ and O$_2$ and the duration of the plurality of flow rates to define the linear decreasing ramp function were created. An example of a portion of a reconfigured program containing the ramped cleaning process is presented in TABLE 2.

TABLE 2

```
STEP 19 of 40: (START CLEAN STEP 4)
    EXECUTE: hen3ry (timeout, 30 sec)
    Device Description              Action
    adp1 Throttle Valve             SetAdaptorPressure(hppr)
    vl47 NF3-O2 Crossover.          Open Valve
    mfc2 Oxygen MFC                 SetFlow(O2-4)
    mfc3 Nitrogen Trifluoride       SetFlow(NF34)
    gen1 SCVD HF RF Generator       SetGenPower(hprf)
    ENDING CONDITIONAL: (loop delay, 100 msec)
    adp1 Throttle Valve             IsPressureInPercent(20)
    AND OBJC                        csk2
STEP 20 of 40: (PERFORM CLEAN STEP 4)
    EXECUTE: hen3ry (timeout, 300 sec)
    Device Description              Action
    clk2                            SetTicks(HF-4)
    ENDING CONDITIONAL: (loop delay, 100 msec)
    clk2                            NOT IsTicksExpired
    AND OBJC                        csk2
STEP 21 of 40: (START CLEAN STEP 5)
    EXECUTE: hen3ry (timeout, 30 sec)
    Device Description              Action
    adp1 Throttle Valve             SetAdaptorPressure(hppr)
    vl47 NF3-O2 Crossover.          Open Valve
    mfc2 Oxygen MFC                 SetFlow(O2-5)
    mfc3 Nitrogen Trifluoride       SetFlow(NF35)
    gen1 SCVD HF RF Generator       SetGenPower(hprf)
    ENDING CONDITIONAL: (loop delay, 100 msec)
    adp1 Throttle Valve             IsPressureInPercent(20)
    AND OBJC                        csk2
STEP 22 of 40: (PERFORM CLEAN STEP 5)
    EXECUTE: hen3ry (timeout, 300 sec)
    Device Description              Action
    clk2                            SetTicks(HF-5)
    ENDING CONDITIONAL: (loop delay, 100 msec)
    clk2                            NOT IsTicksExpired
    AND OBJC                        csk2
STEP 23 of 40: (START CLEAN STEP 6)
    EXECUTE: hen3ry (timeout, 30 sec)
    Device Description              Action
    adp1 Throttle Valve             SetAdaptorPressure(hppr)
    vl47 NF3-O2 Crossover.          Open Valve
    mfc2 Oxygen MFC                 SetFlow(O2-6)
    mfc3 Nitrogen Trifluoride       SetFlow(NF36)
    gen1 SCVD HF RF Generator       SetGenPower(hprf)
    ENDING CONDITIONAL: (loop delay, 100 msec)
    adp1 Throttle Valve             IsPressureInPercent(20)
    AND OBJC                        csk2
STEP 24 of 40: (PERFORM CLEAN STEP 6)
    EXECUTE: hen3ry (timeout, 300 sec)
    Device Description              Action
    clk2                            SetTicks(HF-6)
    ENDING CONDITIONAL: (loop delay, 100 msec)
    clk2                            NOT IsTicksExpired
    AND OBJC                        csk2
STEP 25 of 40: (START CLEAN STEP 7)
    EXECUTE: hen3ry (timeout, 30 sec)
    Device Description              Action
    adp1 Throttle Valve             SetAdaptorPressure(hppr)
    vl47 NF3-O2 Crossover.          Open Valve
    mfc2 Oxygen MFC                 SetFlow(O2-7)
    mfc3 Nitrogen Trifluoride       SetFlow(NF37)
    gen1 SCVD HF RF Generator       SetGenPower(hprf)
    ENDING CONDITIONAL: (loop delay, 100 msec)
    adp1 Throttle Valve             IsPressureInPercent(20)
    AND OBJC                        csk2
STEP 26 of 40: (PERFORM CLEAN STEP 7)
    EXECUTE: hen3ry (timeout, 300 sec)
    Device Description              Action
    clk2                            SetTicks(HF-7)
    ENDING CONDITIONAL: (loop delay, 100 msec)
    clk2                            NOT IsTicksExpired
    AND OBJC                        csk2
STEP 27 of 40: (START CLEAN STEP 8)
    EXECUTE: hen3ry (timeout, 30 sec)
    Device Description              Action
    adp1 Throttle Valve             SetAdaptorPressure(hppr)
    vl47 NF3-O2 Crossover.          Open Valve
    mfc2 Oxygen MFC                 SetFlow(O2-8)
    mfc3 Nitrogen Trifluoride       SetFlow(NF38)
    gen1 SCVD HF RF Generator       SetGenPower(hprf)
    ENDING CONDITIONAL: (loop delay, 100 msec)
    adp1 Throttle Valve             IsPressureInPercent(20)
    AND OBJC                        csk2
STEP 28 of 40: (PERFORM CLEAN STEP 8)
    EXECUTE: hen3ry (timeout, 300 sec)
    Device Description              Action
    clk2                            SetTicks(HF-8)
    ENDING CONDITIONAL: (loop delay, 100 msec)
    clk2                            NOT IsTicksExpired
    AND OBJC                        csk2
STEP 29 of 40: (START CLEAN STEP 9)
    EXECUTE: hen3ry (timeout, 30 sec)
    Device Description              Action
    adp1 Throttle Valve             SetAdaptorPressure(hppr)
    vl47 NF3-O2 Crossover.          Open Valve
    mfc2 Oxygen MFC                 SetFlow(O2-9)
    mfc3 Nitrogen Trifluoride       SetFlow(NF39)
    gen1 SCVD HF RF Generator       SetGenPower(hprf)
    ENDING CONDITIONAL: (loop delay, 100 msec)
    adp1 Throttle Valve             IsPressureInPercent(20)
    AND OBJC                        csk2
STEP 30 of 40: (PERFORM CLEAN STEP 9)
    EXECUTE: hen3ry (timeout, 300 sec)
    Device Description              Action
    clk2                            SetTicks(HF-9)
    ENDING CONDITIONAL: (loop delay, 100 msec)
    clk2                            NOT IsTicksExpired
    AND OBJC                        csk2
STEP 31 of 40: (START CLEAN STEP 10)
    EXECUTE: hen3ry (timeout, 30 sec)
    Device Description              Action
    adp1 Throttle Valve             SetAdaptorPressure(hppr)
    vl47 NF3-O2 Crossover.          Open Valve
    mfc2 Oxygen MFC                 SetFlow(O210)
    mfc3 Nitrogen Trifluoride       SetFlow(NF10)
    gen1 SCVD HF RF Generator       SetGenPower(hprf)
    ENDING CONDITIONAL: (loop delay, 100 msec)
    adp1 Throttle Valve             IsPressureInPercent(20)
    AND OBJC                        csk2
STEP 32 of 40: (PERFORM CLEAN STEP 10)
    EXECUTE: hen3ry (timeout, 300 sec)
    Device Description              Action
```

TABLE 2-continued

| | |
|---|---|
| clk2 | SetTicks(HF10) |
| ENDING CONDITIONAL: (loop delay, 100 msec) | |
| clk2 | NOT IsTicksExpired |
| AND OBJC | csk2 |

Figure 4A:
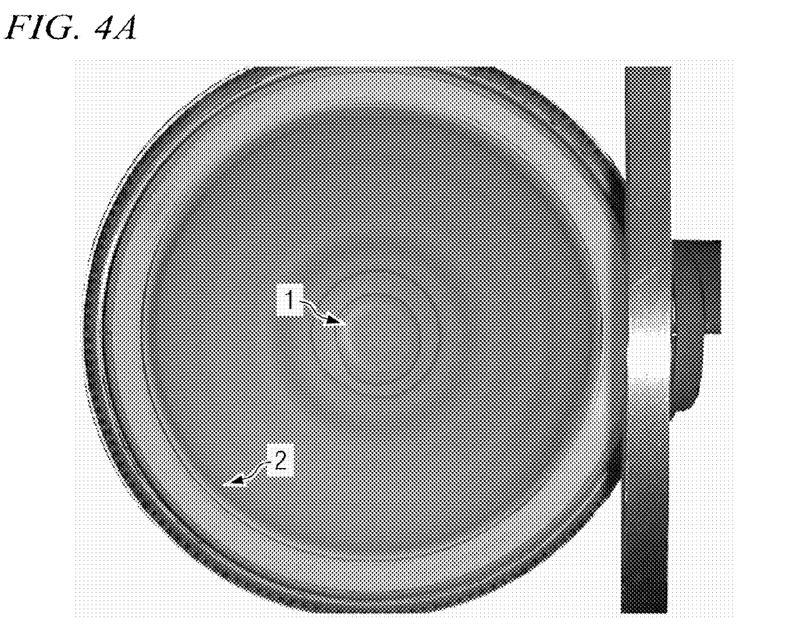
FIGS. 4A and 4B show exemplary interior surfaces of deposition chambers after repeated material layer depositions and in situ cleaning processes using: (A) a conventional two-step cleaning process, and (B) a ramped cleaning process of the present invention, respectively.
Figure 4B:
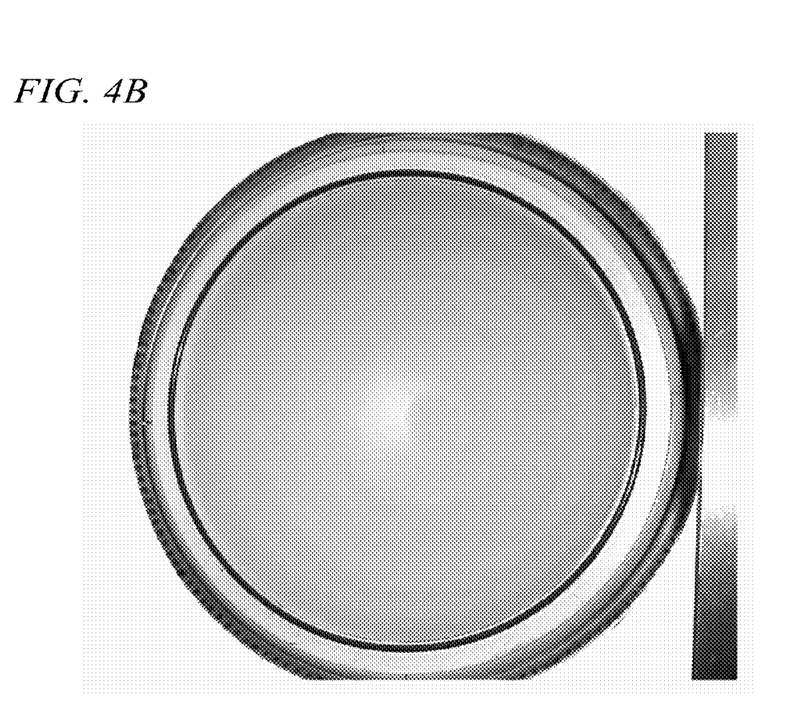

FIGS. 4A and 4B show exemplary interior surfaces of the dome of the deposition chamber after about 100 FSG deposition hours and intermittent in situ two-step or ramped cleaning processes, respectively. As shown in FIG. 4A, the dome of the chamber that was subjected to the prior art two-step cleaning process had several dark rings corresponding to localized $AlF_3$ deposits at the top and bottom of the dome (arrows 1 and 2, respectively) in particular. The most prominent $AlF_3$ deposits are estimated to have thicknesses of about 0 to about 1000 microns. In contrast, as shown in FIG. 4B, the dome of the chamber that received the ramped cleaning process provided by the present invention did not have any prominent dark rings, signifying the absence or localized $AlF_3$ deposits.

As a further comparison of the ramped and two step cleaning processes described in TABLE 1, the results of a marathon session of FSG depositions and intermittent in situ cleaning processes were compared. When using the prior art two-step cleaning process, it was found that after about 200 FSG deposition hours, it was necessary to change the dome of the deposition chamber. A dome change was necessitated because either the in-line defect density step increases or a yield of functional semiconductor device decreases below a predefined limit. As an example, in certain semiconductor device manufacturing processes the predefined limit is about 2 percent yield of function semiconductor devices. In contrast, when using the ramped cleaning process of the present invention, a dome change was not indicated until about 400 FSG deposition hours.

Although the present invention has been described in detail, one of ordinary skill in the art should understand hat they can make various changes, substitutions and alterations herein without departing from the scope of the invention.

What is claimed is:

1. A system for cleaning a deposition chamber, comprising:
  a deposition chamber having an interior surface and configured to perform chemical vapor deposition (CVD) processes; and
  a controller configured to provide a ramped cleaning process in between the CVD processes, the ramped cleaning process including:
    forming an in-situ reactive plasma cleaning zone by dissociating a gaseous fluorocompound introduced into the deposition chamber in a presence of a plasma; and
    ramping a flow rate of the gaseous fluorocompound to move the reactive plasma cleaning zone throughout the deposition chamber to remove the deposited material to a desired end-point and thereby preventing a build-up of localized metal compound deposits on the interior surface;
    wherein the ramping is achieved by adjusting the flow rate according to a ramp function,
    and wherein the ramp function defines a linear change in the flow rate over a cleaning time.

2. The system as recited in claim 1, wherein the controller includes one or more mass flow controllers for introducing the gaseous fluorocompound into the deposition chamber.

3. The system as recited in claim 1, wherein the controller further includes:
  a computer configured to read a data file having settings for the ramped cleaning process; and
  a computer readable media capable of causing the computer to produce a signal to initiate the ramped cleaning process.

4. A system comprising:
  a deposition chamber having an interior with an interior surface, wherein the deposition chamber is configured to perform CVD processes, and wherein a film is deposited on at least a portion of the interior surface during each CVD process;
  a mass flow controller that is secured to the deposition chamber, wherein the mass flow controller is in fluid communication with a supply of a gaseous fluorocompound and the interior of the deposition chamber;
  a substrate station located within the deposition chamber;
  a detector that is secured to the deposition chamber, wherein the detector measures optical emissions from at least one of fluorine and carbon monoxide;
  an radio frequency (RF) power source that is configured to generate a plasma in the interior of the deposition chamber;
  a controller that is in communication with the mass flow controller, the RF power source, and the detector, wherein the controller performs a ramped cleaning process between consecutive CVD processes to preventing a build-up of localized metal compound deposits on the interior surface of the deposition chamber by dissociating the gaseous fluorocompound introduced into the deposition chamber by the mass flow controller in a presence of a plasma formed by the RF power source to generate an in-situ reactive plasma cleaning zone and by ramping a flow rate of the gaseous fluorocompound with the mass flow controller to move the reactive plasma cleaning zone throughout the deposition chamber to remove the deposited material to a desired end-point;
  wherein the ramping is achieved by adjusting the flow rate according to a ramp function,
  and wherein the ramp function defines a linear change in the flow rate over a cleaning time.

5. The system as recited in claim 4, wherein the controller includes two or more mass flow controllers for introducing the gaseous fluorocompound into the deposition chamber.

6. The system as recited in claim 4, wherein the controller further includes:
  a computer configured to read a data file having settings for the ramped cleaning process; and
  a computer readable media capable of causing the computer to produce a signal to initiate the ramped cleaning process.

7. The system as recited in claim 4, wherein the detector further comprises an optical spectrometer that measures optical emissions at a wavelength of about 704 nm or a wavelength of about 483 nm.

* * * * *